United States Patent [19]

Sato et al.

[11] 4,244,002

[45] Jan. 6, 1981

[54] SEMICONDUCTOR DEVICE HAVING BUMP TERMINAL ELECTRODES

[75] Inventors: Susumu Sato; Hideo Tsunemitsu, both of Tokyo, Japan

[73] Assignee: Nippon Electric Co., Ltd., Tokyo, Japan

[21] Appl. No.: 952,543

[22] Filed: Oct. 18, 1978

[30] Foreign Application Priority Data

Oct. 19, 1977 [JP] Japan ................................ 52/126318

[51] Int. Cl.³ .......................................... H01L 23/48
[52] U.S. Cl. ...................................... 357/68; 357/69; 357/71
[58] Field of Search ........................... 357/68, 71, 69

[56] References Cited

U.S. PATENT DOCUMENTS

| 4,051,508 | 9/1977 | Sato et al. | 357/68 |
| 4,060,828 | 11/1977 | Satonaka | 357/71 |

*Primary Examiner*—Edward J. Wojciechowicz
*Attorney, Agent, or Firm*—Hopgood, Calimafde, Kalil, Blaustein & Lieberman

[57] ABSTRACT

A semiconductor structure in which metallic connecting leads are bonded to bump terminal electrodes by thermal pressure bonding. A stress mitigation layer is advantageously provided in the semiconductor structure which prevents or reduces breaking of the semiconductor substrate or an insulating film when thermal pressure bonding is applied to the bump terminal electrode.

10 Claims, 12 Drawing Figures

SEMICONDUCTOR DEVICE HAVING BUMP TERMINAL ELECTRODES

FIELD OF THE INVENTION

This invention generally relates to semiconductor devices, and more particularly, to semiconductor devices having bump terminal electrodes to which metallic connecting leads are bonded.

DESCRIPTION OF THE PRIOR ART

Various new methods have been proposed, in place of the conventional wire bonding, for making electrical connection of connecting leads with metallic terminal electrodes of a semiconductor device. One recent technique that has been proposed for LSI application is gang bonding in which connecting leads are prepared from a stripe of metal foil on a plastics tape, with their end portions thinly formed, to be directly and simultaneously bonded to metallic protrusions (bumps) at IC terminal electrodes. A gang bonding method of this type is described, for example, in U.S. Pat. No. 3,763,404, U.S. Pat. No. 4,051,508 or "SOLID STATE TECHNOLOGY" Oct. 1975, pp46–pp52.

The abovementioned bumps are usually formed by gold on the edge of a wiring layer extending on the insulating film of the semiconductor substrate and connected to a region thereof. For example, the bump is about 100 μm wide at each side and about 10∼20 μm high from the upper surface of the semiconductor element. The leads to be connected to the bumps consist of tin- or gold-plated copper foils, which have a thickness of 20∼40 μm, and a width of about 100 μm substantially equal to the bump size.

This connection method is widely used for tin-plated copper leads because gold-tin eutectic can be obtained at a low temperature and under a low bonding pressure. Leads of this type, however, present a critical problem in that a single crystalline tin whisker can cause an electric short between the leads. For this reason, gold-plated copper leads are favorably employed in high-reliability devices because gold plated leads show no whisker formation. However, when a gold-plated copper lead is actually bonded to a gold bump, a greater bonding load is required, under high temperatures to obtain satisfactory mechanical strength at the connection between the lead and the bump in comparison with tin-plated copper leads. Therefore, to achieve a satisfactory bond a bump having a strong mechanical strength is required, and bump structures having improved mechanical strength are disclosed in the above-referred U.S. Pat. No. 4,051,508. In these improved structures, the bump is formed in a stepped form, and some success has been obtained by projecting mitigation of stress concentration upon bonding, with respect to the cross-sectional profile of the structure.

However, even with such structures the mitigation of stress concentration is not satisfactory. For example, if the temperature upon bonding is raised to 350° C., cracks will appear in the silicon substrates at a rate of approximately 2% of the total bump structures. While ordinarily more than several tens of bumps are provided on the same substrate in the conventional LSI structure, in case where LSI's are larger in size, then it may be necessary to provide, for example, 120 bumps on the same substrate. With large size LSI's having a large number of bumps, it becomes necessary to further enhance the temperature and the load in the bonding process. Investigation, by the inventors, on the section where cracks are typically generated has revealed, that the cracks caused by this temperature rise are generated from a substrate portion underlying the connecting section between a bump terminal electrode and a wiring layer. In other words, in order to fully prevent breaking of a substrate or an insulating film on a substrate caused by stress concentration, it is important to take into consideration stress distribution along the plane of the substrate, in that the wiring layer is always connected to a bump terminal electrode. In addition it must be taken into consideration that the mode of stress distribution or stress concentration depends not only upon a mechanical factor but also upon a thermal factor.

Heretofore, with regard to the connection between the bump terminal electrode and the wiring layer, the width of the wiring layer was determined according to current capacity, and the wiring layer was directly connected to the bump terminal. In addition the narrow width of the wiring layer was maintained at the connecting portion. Consequently, with respect to a semiconductor device having a conventional connecting structure between the wiring layer and the bump, if a connecting lead and the bump terminal are connected by thermal pressure bonding and a pulling break strength test is conducted, then with regard to a breaking mode, breaking is generated from the substrate or the insulating film underneath the connecting portion between the bump and the wiring layer. This results because stress is concentrated at the connecting portion, which has a possibility of being mechanically weakened by an aging effect resulting from thermal stress or the like. In an attempt to solve this problem the inventors of the instant invention prepared a test piece in which an internal wiring layer was not connected to a bump, and conducted experiments under various conditions. Their tests confirmed the necessity for taking into consideration a stress distribution along the plane of the substrate.

It is therefore an object of the present invention is to provide a semiconductor device having a novel connecting structure between a bump terminal electrode and a wiring layer that can withstand heat and pressure applied upon thermal pressure bonding of external connecting leads.

According to one feature of the present invention, there is provided a semiconductor device comprising a semiconductor substrate, an insulating film coating at least a part of the semiconductor substrate, a bump terminal electrode provided on the insulating film, a wiring layer connected to a region formed in the semiconductor substrate and extending on the insulating film, and a stress mitigation layer for preventing or reduucing breaking of the substrate or the insulating film when the thermal pressure bonding is applied to the bump terminal electrode. The mitigation layer is provided on the insulating film and having one end connected to an end of the wiring layer and the other end connected to the bump terminal electrode.

In accordance with another feature of the present invention the stress mitigation layer has a lowermost film which is integrated with the lowermost film of the bump terminal electrode and contacting at least with the substrate, or an insulating film on the substrate, and with the lowermost film of the wiring layer.

In accordance with still another feature of the present invention the stress mitigation layer includes the lowermost film and the uppermost film, and the uppermost film is located within the lowermost film in the plan configuration.

Yet another feature of the present invention is that the uppermost films of the stress mitigation layer and the wiring layer and the intermediate film of the bump terminal electrode are formed continuously in the same thickness and material.

A further feature of the present invention is that there is provided a stress mitigation layer extending in a tapered form from the bump terminal electrode to the wiring layer in the plan configuration as viewed perpendicularly to the plane of the substrate.

A still further feature of the present invention is that there is provided a stress mitigation layer, extending as a straight portion of larger width than the wiring layer, from the bump terminal electrode to the wiring layer in the plane configuration as viewed perpendicularly to the plane of the substrate.

A yet further feature of the present invention is that the stress mitigation layer, extending from the bump terminal electrode to the wiring layer, has a length larger than 5 $\mu$m and smaller than 60 $\mu$m.

The foregoing and other objects and features of this invention will be more fully industrial from the following description of an illustrative embodiment thereof taken in conjunction with the accompanying drawings.

DETAILED DESCRIPTION

Figure 1A:
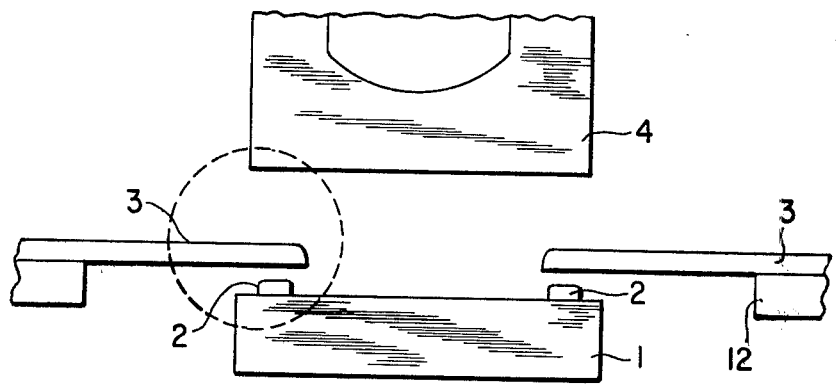
FIG. 1(A) is a cross-sectional view showing a semiconductor device along with its external connecting leads and a bonding tool.

Referring to FIG. 1(A), which shows a prior art device, the bump terminal electrodes 2, formed on a silicon substrate incorporating therein semiconductor elements, the tip of the external connecting leads 3, attached to a plastic tape 12, and a bonding tool 4, are positioned in a predetermined relationship. The bonding tool 4 is lowered, thereby applying a mechanical load to the bonding portions between the leads and the bumps. When a predetermined load is attained, an electric current is caused to flow through the tool, thereby bonding the gold leads to the bumps by means of the applied mechanical load and the heat generated at the tool by the current flowing therethrough.

Figure 1B:
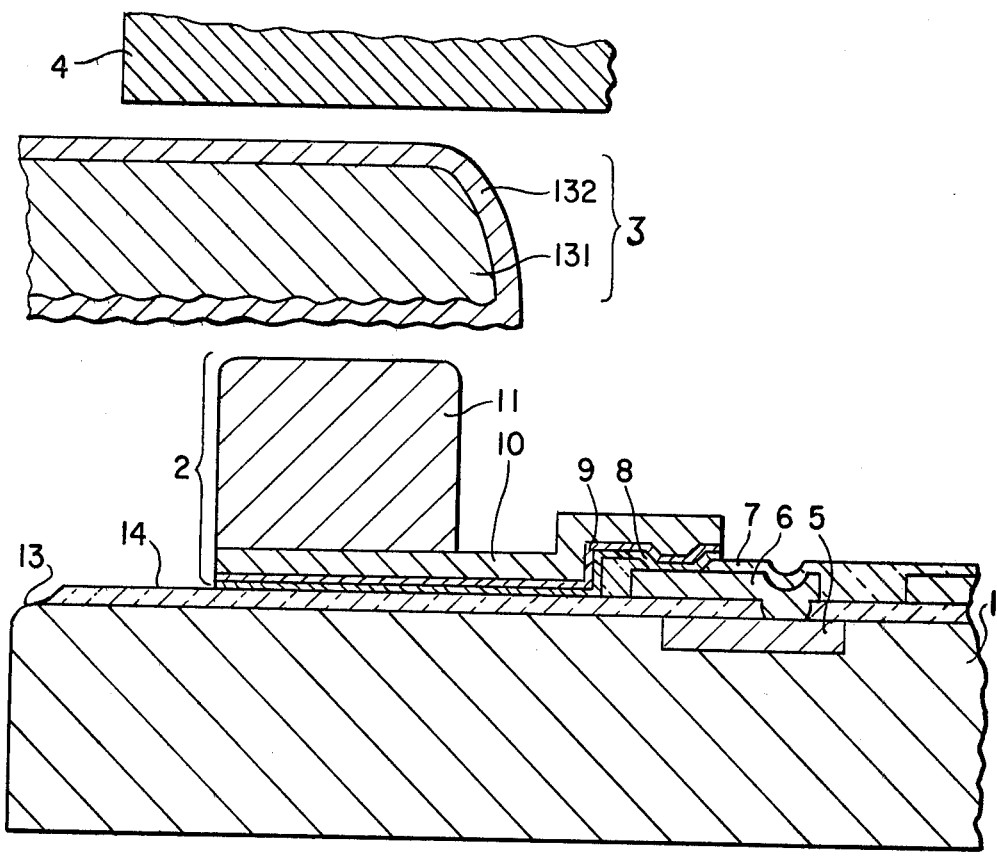
FIG. 1(B) is an enlarged cross-sectional view of the portion encircled by the dotted line in FIG. 1(A) showing details of the semiconductor device and the relationship between the leads, bumps and bonding tool.

Referring to FIG. 1(B), aluminum is generally used in a typical prior art device as a material for wiring the active regions of the semiconductor elements and also for the electrodes, while the bump is generally made of gold. For the purpose of preventing formation of purple-plaque between aluminum and gold, another conductive layer is formed by continuous sputtering of a refractory metal and platinum to thereby form an intermediate wiring layer to connect an inner aluminum wiring layer to a bump. In more detail, a silicon substrate 1 incorporates therein transistors, resistors and the like (not shown) and has an impurity diffused region 5 which is shown as representative of a portion of a circuit element incorporated in the substrate 1. Inner aluminum layer 6 is connected to the region 5 and is formed on insulating film 14 (SiO$_2$) which covers the major surface of the semiconductor substrate 1. The wiring layer, connected to the inner layer 6 via an aperture of insulating layer 7, consists of a titanium film 8 for obtaining adhesion with an insulating film 14, platinum film 9 as a barrier and a gold film 10 for wiring. A bump terminal electrode 2 consists of triple films 8, 9, 10, continuously extended from the wiring layer, and a thick gold film 11. The connecting lead 3 generally made of copper member 131 and gold-plating 132, is applied onto the surface in order to effect thermal pressure bonding with the gold bump 2. In the cooper as substrate of the connecting lead, the bonding surface relative to the bump is coarsened and made uneven in order to obtain sufficient adhesion between the surface and an adhesive applied to the plastic tape 12. The unevenness is further enhanced when gold is electroplated onto the copper surface. Reference numeral 13 represents the aforementioned cracks and chipping of the contour portion of the semiconductor substrate 1.

Figure 2A:
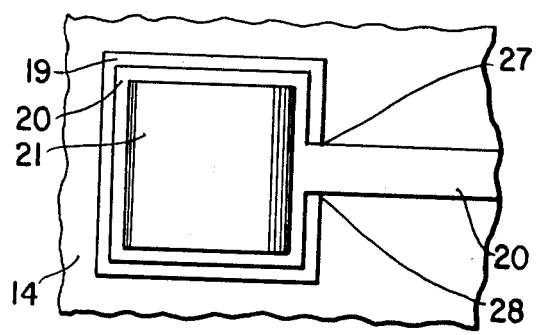
FIGS. 2(A) and 2(B) are a partial plan view and a partial side view, respectively, of prior art semiconductor devices having bump terminal electrodes.
Figure 2B:
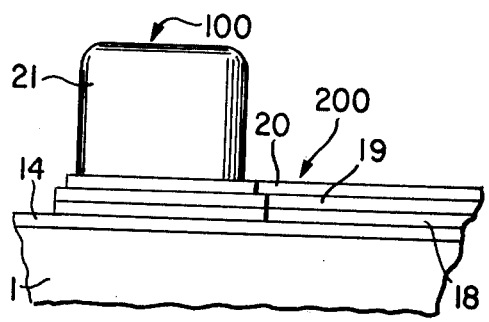

A semiconductor device having bump terminal electrodes according to the prior art is illustrated in FIGS. 2(A) and 2(B), in which a titanium film 18, of 1500 Å in thickness, a platinum film 19, 2500 Å in thickness, and a thin gold film 20, 1 $\mu$m in thickness, are successively laminated on an insulating film 14 such as a silicon oxide film or silicon nitride film formed on a major surface of a silicon substrate 1. A thick gold layer 21 of 2.5 $\mu$m in thickness is formed on a part of the thin gold film 20. Accordingly, bump terminal electrode 100 is comprised of titanium film 18 and platinum film 19, both having a plan configuration of a 100 $\mu$m square, thin gold film 20, 80 $\mu$m square, and thick gold layer 21, 60 $\mu$m square. Wiring layer 200 is comprised of titanium film 18, platinum film 19 and thin gold film 20, all having a width of 10 $\mu$m. It is to be noted that in the prior art construction, wiring layer 200 is directly connected to bump terminal electrode 100. When an external connecting lead (not shown) formed of gold-plated copper foil is placed on such a bump terminal, electron-de 100, heat and pressure are applied thereto, the gold on the surface of the lead and the thick gold layer 21 are bonded together.

A break test has been conducted with respect to the bonded semiconductor device. The test included pulling the bonded lead in a direction perpendicular to the principal surface of the semiconductor by means of a tension gauge, to thereby investigate the strength and breaking mode of the semiconductor device. When thermal pressure bonding was conducted with a bonding pressure of 2000 Kg/cm² at 500° C., which are more severe conditions than normal conditions (1200 Kg/cm² and 300° C.), and the pulling break test was carried out with respect to the bonded structures, disconnection occurred with a pulling force of 20 g or larger. Disconnection of the bump structures occurred either at the external connecting lead, at the junction between the lead and the bump, at the junction between the bump and the insulating film or at the substrate portion. The disconnection of the external lead indicates satisfactory bonding pressure while disconnection at the two junctions indicates poor bonding and poor adhesion between the bump and the insulating film, respectively. The disconnection at the substrate portion indicates that the bonded lead and bump structure as a whole has been torn from the substrate or from the insulating film. This is caused by cracks generated in the silicon substrate or in the insulating film. Torn disconnections were 12.5% of the total disconnections and this percentage is unsatisfactory for proper operation.

Figure 3A:
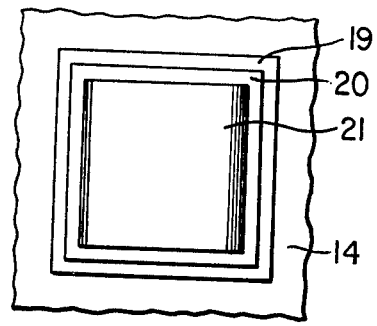
FIGS. 3(A) and 3(B) are a partial plan view and a partial side view, respectively, of a test piece used for confirming the effect of the wiring layer in the semiconductor device in FIG. 2 upon breaking of the same semiconductor device.
Figure 3B:
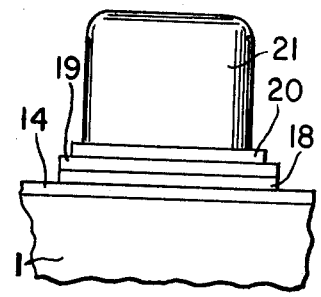

A test piece as illustrated in FIGS. 3(A) and 3(B) was prepared. In this test piece, only the wiring layer 200 in FIG. 2 was removed and the remaining construction was exactly the same as that shown in FIG. 2. Performance of the pulling break test, under the same conditions as in the case of the semiconductor device in FIG. 2, resulted in torn disconnections of the bonded structurre, due to cracks in the silicon substrate or in the insulating film, being reduced to 4.9% of the total disconnections.

From the comparative investigation with the reference bump in the above-described test piece, it is obvious that the generation of defects in the silicon substrate was affected by the wiring layer and the connecting portion between the bump terminal electrode and the wiring layer. Furthermore, when carefully observing the silicon substrate at the bottom of the bump, broken during the pulling break test, it was found that the breaking started from the cross-points 27 and 28 of FIG. 2(A) between the outer periphery of the bump 100 and the opposite edges of the wiring layer 200.

From the aforementioned results of pulling break tests on the semiconductor device in the prior art as shown in FIG. 2 and the test piece as shown in FIG. 3, the following three effects of heat and pressure applied to the bump upon thermal pressure bonding have been recognized. First, the silicon substrate at the bottom of the peripheral portion of the bump is broken by concentrated stress that is generated by the pressure applied to the bump section and strain caused by the heat applied to the bump section. Second, in the structure in which a wiring layer is connected to the bump, the heat applied to the bump upon thermal pressure bonding is transmitted to the wiring layer. This results because the wiring layer consists of a good electrical conductor and has good thermal conductivity, resulting in a large temperature gradient between the wiring layer and the underlying insulating film or the further underlying silicon substrate. Due to this temperature gradient, thermal strain will arise in the substrate under the wiring layer in an especially marked manner along the lengthwise direction of the wiring layer. Third, owing to the fact that the heat is applied to the wiring layer through the bump, the thermal strain becomes maximum at the connecting portion between the bump and the wiring layer.

From the above-mentioned findings it is believed that, at the connecting portion between the bump and the wiring layer, the strain caused by the pressure applied to the bump, the strain caused by the heat applied to the bump and the strain caused by the heat at the wiring layer are combined, and cracks are generated in the substrate. In addition, in the pulling break strength test, these cracks serve as nuclei of breaking which cause breaking of the substrate and tearing-off of the bonded lead-bump structure from the substrate. On the basis of the above analysis it has been concluded that in order to prevent the cracks in the substrate it is necessary to minimize the thermal stress generated by the wiring layer in the neighborhood of the bump, that is, to reduce the temperature difference between the wiring layer and the silicon substrate and the temperature gradient at the wiring layer along the length wise direction of the wiring layer. These requirements can be fulfilled by providing a thermal stress mitigation layer at the connecting portion between the bump terminal electrode and the wiring layer. Such a layer is designed to have a large area at a plan view between the wiring layer and the substrate and gradual variation in area from the bump terminal electrode towards the wiring layer.

DESCRIPTION OF PREFERRED EMBODIMENTS

EMBODIMENT 1

Figure 4A:
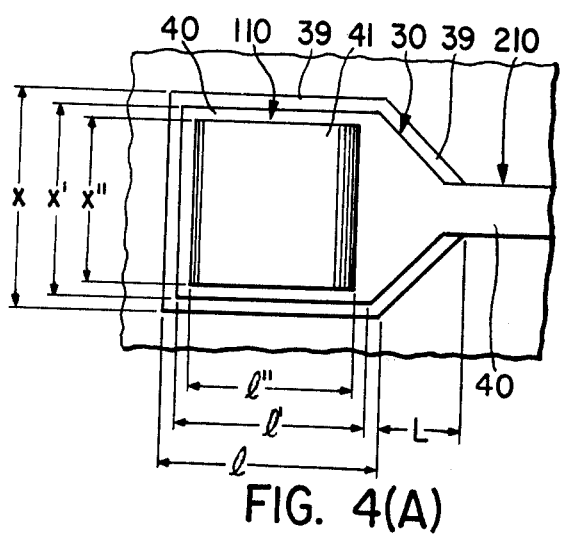
FIGS. 4(A) and 4(B) are a partial plan view and a partial side view, respectively, of a semiconductor device having bump terminal electrodes according to a first preferred embodiment of the present invention.
Figure 4B:
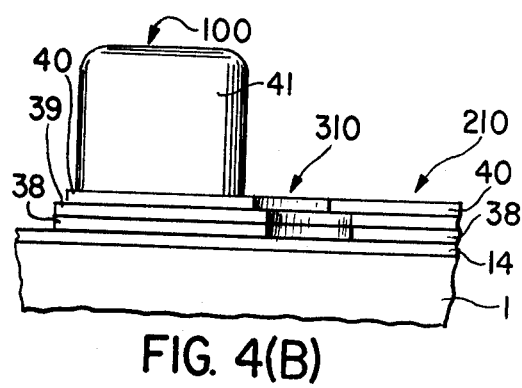

A first preferred embodiment of the present invention is shown in FIGS. 4(A) and 4(B). While the general construction is similar to the conventional semiconductor device shown in FIGS. 2(A) and 2(B), a stress mitigation layer 310, consisting of the same materials as the wiring layer 210, is provided between the wiring layer 210 and the bump terminal electrode 110 in order to absorb thermal strain caused from the wiring layer side.

More particularly, a titanium film 38 of 1500 Å in thickness, a platinum film of 2500 Å in thickness and a thin gold film 40 of 1 μm in thickness are successively laminated on an insulating film 14. Film 14 consists of a silicon oxide film, a silicon nitride film or the like provided on a major surface of a silicon substrate 1, and a thick gold film 41 of 2.5 μm in height provided on the bump section of the thin gold film 40. The width W of the wiring layer 210 is 10 μm. The width x and length l of the titanium film 38 and platinum film 39 in the bump terminal electrode 110 are both 100 μm, which the width x' and length l' of the thin gold film 40 are both 80 μm and the width x'' and length l'' of the thick gold film 41 are both 60 μm. As described above, the bump terminal electrode 110 has a double-stepped structure consisting of a lowermost film formed by the films 38 and 39, an intermediate film formed by the film 40, and the uppermost film formed by the film 41. The wiring layer 210 has a non-step structure integrally formed by the films 38, 39 and 40; and the stress mitigation layer 310 has a single-stepped structure consisting of the lowermost film formed by the films 38 and 39 and the uppermost film formed by the film 40.

The plan configuration of the stress mitigation layer is selected to be a trapezoidal shape defined by one edge of the bump opposed to the wiring layer 210, tapered side edges extending from the opposite ends of said one edge of the bump, inclined inwardly at 45° with respect to said one edge towards the wiring layer, and a line connecting the cross-points between said tapered side edges and the corresponding parallel edges of the wiring layer. This shape optimizes the mitigation effect for the thermal strain caused by the wiring layer. In the illustrated embodiment, the bump terminal electrode consists of a 100 μm square, and the width of the wiring layer is 10 μm, and the length L of the stress mitigation layer 310 is equal to 45 μm. Length L should be preferably 5 μm or longer for the purpose of achieving the desired effect and preferably shorter than 60 μm when taking into consideration the saturation length for the desired effect as well as the degree of integration of the semiconductor device. In addition, by making the boundary between platinum film 39 and thin gold film 40 in a stepped form, the overall peripheral stress, generated in the insulating film 14, adjacent to the periphery of the titanium film 38, and in the underlying silicon substrate 1, can be reduced.

For such a bump structure, an external connecting lead was thermal-pressure-bonded onto the thick gold layer 41 with a pressure of 2,000 Kg/cm² at 500° C. These conditions are more severe than practical conditions. A pulling test was conducted for the bonded lead in every test sample, disconnection occurred at a pulling force of 30 g or larger, and only 0.9% of the total disconnections were torn-off disconnection caused by cracks in the silicon substrate. These results are not only greatly improved over the results for the conventional semiconductor construction shown in FIG. 2, but also improved the results for the test piece shown in FIG. 3. This indicates that the stress mitigation layer, according to the present invention not only absorbs the effects of the thermal stress caused by the wiring layer, but also mitigates the stress caused by heat and pressure upon thermal pressure bonding.

EMBODIMENT 2

Figure 5:
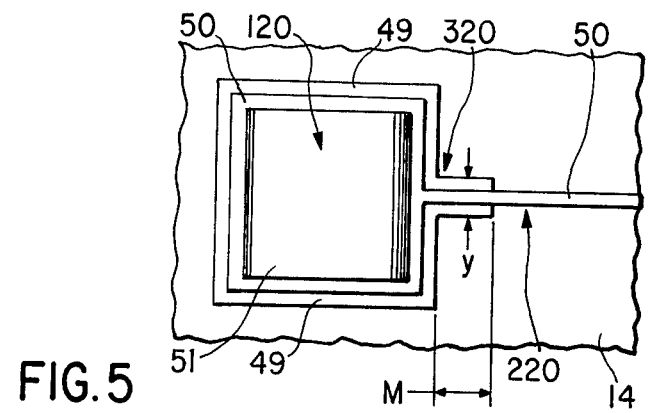
FIG. 5 is a partial plan view showing a second preferred embodiment of the present invention.

Referring to FIG. 5, a second preferred embodiment of the present invention is provided with as tress mitigation layer 320 between a bump terminal electrode 120, consisting of a titanium-platinum film 49, a thin gold film 50 and thick gold film 51, and wiring layer 220, consisting of a titanium-platinum film 49 and a thin gold film 50. More particularly, on insulating film 14, above the silicon substrate the stress mitigation layer 320 is formed of a titanium-platinum film 49 having a width y of 30 μm, broader than the 10 μm width of the wiring layer 220, and having a length M of 50 μm. Length M should preferably be 5 μm or longer for the purpose of achieving the desired stress mitigation effect, and it should preferably be shorter than 60 μm, that is, the length at which the effect is saturated. In addition, width y of the stress mitigation layer 320 should preferably be larger than the width of the wiring layer 220 by at least 10 μm. With respect to the above-described structure, a comparative experiment with conventional structure, as shown in FIG. 2, was conducted through the same method of experiment described previously. It was found that breaking in the silicon substrate at the bottom of the bump, accounted for 8.3% of the total disconnections. Thus it is clear that the effect of the stress mitigation layer upon the thermal stress is remarkable, even if the stress mitigation layer is formed in a straight stepped structure in a plan view. It is to be noted that in this embodiment, with regard to the sections other than the stress mitigation region, the plan configuration, film thicknesses and materials are identical to those in the first preferred embodiment.

Embodiment 3

Figure 6:
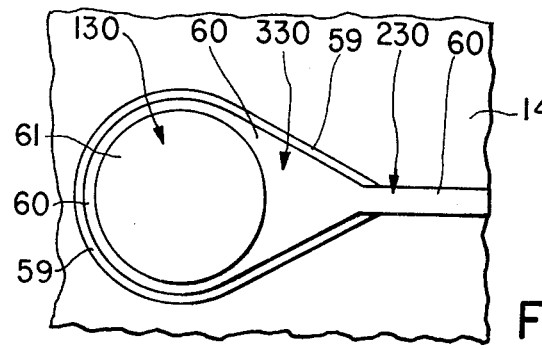
FIG. 6 is a partial plan view showing a third preferred embodiment of the present invention.

In a third preferred embodiment of the present invention shown in FIG. 6, between a bump terminal electrode 130 having a circular plan configuration and a wiring layer 230, there is provided a stress mitigation layer 330 which extends in a tapered shape from the bump towards the wiring layer 230. The tapered shape is delimited by two tangential lines of the circular profile of the bump section. The stress mitigation layer 330 is comprised of the regions of a first film 59 and a second film 60 on the insulating film 14 extending from the bump towards the wiring layer. The bump terminal electrode 130 is comprised of the first film 59, the second film 60 and a third film 61. A structure, according to this preferred embodiment, is expected to have great success in reducing breaking in the silicon substrate.

Embodiment 4

Figure 7:
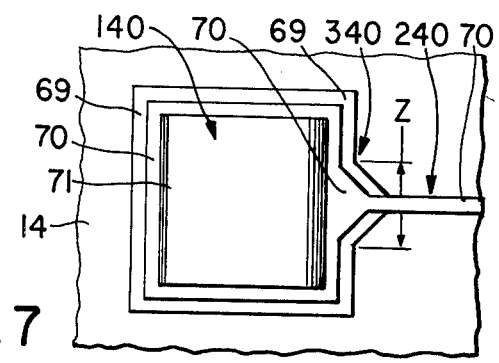
FIG. 7 is a partial plan view showing a fourth preferred embodiment of the present invention.

A fourth preferred embodiment of the present invention shown in FIG. 7 employs a reduced type stress mitigation layer 340 between a bump terminal electrode 140 and a wiring layer 240. The stress mitigation layer 340 is comprised of the same films as a first film 69 and second film 70, on an insulating film 14, in the bump terminal electrode 140. A third thick film 71 is further formed on these two films 69 and 70. Wiring layer 240 consists of the first film 69 and the second film 70 having the same width as the first film 69. This embodiment is employed as a compromise between tolerable stress and space factors. However, in order to achieve the effect in the desired stress mitigation region, width Z, of this stress mitigation region, must be more than 10 μm larger than the width of the wiring layer 240.

Embodiment 5

Figure 8:
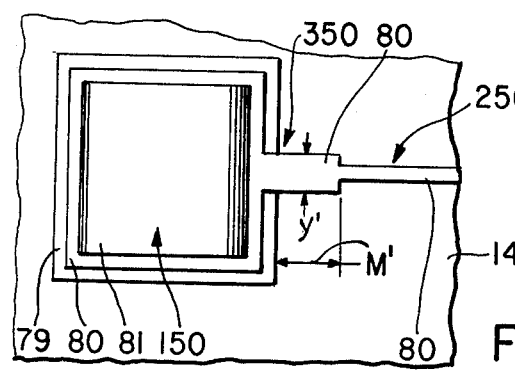
FIG. 8 is a partial plan view showing a fifth preferred embodiment of the present invention.

A fifth preferred embodiment of the present invention, shown in FIG. 8, employs a stress mitigation layer 350 consisting of a first film 79 and a second film 80 formed on an insulating film 14 on the silicon substrate. This embodiment does not include a stepped structure. More particularly, bump terminal electrode 150 is comprised of first film 79, second film 80, formed on the film 79, and a thick third film 81, formed on the film 80. Stress mitigation layer 350 and the wiring layer 250, respectively, are comprised of first film 79 and second film 80 having the same width. This preferred embodiment corresponds to the case where the width of the film 50, in the stress mitigation layer 320, in the second preferred embodiment shown in FIG. 5, has been broadened to the same width as the film 49.

In this preferred embodiment, the length M' of the stress mitigation layer 350 was selected to be 50 μm and the width y' of the same was selected to be 30 μm. The remains construction and conditions were selected to be the same as the first preferred embodiment (FIG. 4). According to the same pulling break test as was conducted with the first preferred embodiment, it was found that torn-off disconnections, due to cracks in the silicon substrate, occured at a rate of 9.2% of total disconnections. In this embodiment, similar to the case of the second preferred embodiment, the effective range of the length M' of the stress mitigation region 350 is preferrably 5—60 μm, while the width y' of the same should be preferably larger than the width of the wiring layer 250 by at least 10 μm.

As described above, according to the present invention, a novel structure of a connecting portion between a bump terminal electrode and a wiring layer, which can withstand high temperature and a high pressure, can be realized without modifying the manufacturing process in the prior art. The selection of bonding metal between an external lead and a bump terminal electrode can be made within a broader range, and bonding of high quality and high reliability thus becomes possible. In addition, highly qualified, less expensive, simultaneous bonding for a large scale integrated semiconductor device, having a large number of bumps, is made possible and thus the industrial significance of this invention is great. While the bump terminal electrodes all had a double-stepped structure in the above-described embodiments, the present invention is, of course, not limited to such structure. The structure of the bump terminal electrode can be single-stepped, non-stepped or multi-stepped, i.e. have three or more steps. Also, the stress mitigation layer is not limited to non-stepped or single-stepped structure, but its structure could be multi-stepped, i.e. two or more steps. Furthermore, the electrical conductive materials in the bump terminal electrode stress mitigation layer and wiring layer are not limited to those described in connection with the illustrated embodiments, but in some cases the corresponding layers in the respective sections could be made of different materials and joined to each other in a continuous layer.

Although a specific embodiment of this invention has been shown and described it will be understood that various modifications may be made without departing from the spirit of the invention.

We claim:

1. A semiconductor device comprising a semiconductor substrate; an insulating film covering at least a part of a major surface of said semiconductor substrate; a bump terminal electrode provided on said insulating film and having an edge; a wiring layer connected to a region formed in said semiconductor substrate and extending on said insulating film, said wiring layer having a width smaller than the length of said edge of said bump terminal electrode; a conductive connecting layer, provided on said insulating film, and having one end connected to an end of said wiring layer and the other end connected to said edge of said bump terminal electrode, said other end having a width larger than said width of said wiring layer, said connecting layer preventing breaking of said semiconductor substrate due to thermal pressure gang bonding applied to said bump terminal electrode.

2. A semiconductor device as claimed in claim 1, in which the length of said conductive connecting layer, between said one end and said other end, is 5 $\mu$m to 60 $\mu$m.

3. A semiconductor device as claimed in claim 1, in which said conductive connecting layer has a tapered shape in a plan configuration as viewed perpendicularly to said major surface, said tapered shape being narrowed from said other end towards said one end.

4. A semiconductor device as claimed in claim 1, in which the width of said conductive connecting layer, at the portion connected to one edge of said bump terminal electrode, is substantially equal to the length of said one edge, and the width of said conductive connecting layer, at the portion connected to said wiring layer, is substantially equal to the width of said wiring layer.

5. A semiconductor device as claimed in claim 1, in which said conductive connecting layer has a straight shape in parallel to said wiring layer in a plan configuration as viewed perpendicularly to said major surface, the width of said conductive connecting layer being larger than the width of said wiring layer but smaller than the width of said bump terminal electrode.

6. A semiconductor device as claimed in claim 5, in which the width of said conductive connecting layer is larger than the width of said wiring layer by at least 10 $\mu$m.

7. A semiconductor device as claimed in claim 1, in which at least the lowermost films contacting with said insulating film of said bump terminal electrode, said conductive connecting layer and said wiring layer are continuously formed in the same thickness and by the same material.

8. A semiconductor device as claimed in claim 1, in which said conductive connecting layer has a lowermost film continuous from lowermost films of said wiring layer and said bump terminal electrode and an uppermost film continuous from an uppermost film of said wiring layer and from an intermediate film of said bump terminal electrode.

9. A semiconductor device as claimed in claim 8, in which said uppermost film of said conductive connecting layer is located within said lowermost film of the same layer in a plan configuration as viewed perpendicularly to said major surface.

10. A semiconductor device comprising a semiconductor substrate; an insulating film covering at least a part of a major surface of said semiconductor substrate; a bump terminal electrode provided on said insulating film, said bump terminal electrode having a circular shape in a plan configuration as viewed perpendicularly to said major surface; a wiring layer connected to a region formed in said semiconductor substrate and extending on said insulating film; and a conductive connecting layer, provided on said insulating film, and having one end connected to an end of said wiring layer and the other end connected to said bump terminal electrode, said connecting layer extending in a tapered shape from said bump terminal electrode towards the wiring layer as delimited by two tangential lines of the circular profile of said bump terminal electrode, said connecting layer preventing breaking of said semiconductor substrate due to thermal pressure bonding applied to said bump terminal electrode.

* * * * *